United States Patent

Zhu et al.

[11] Patent Number: 5,838,608
[45] Date of Patent: Nov. 17, 1998

[54] MULTI-LAYER MAGNETIC RANDOM ACCESS MEMORY AND METHOD FOR FABRICATING THEREOF

[75] Inventors: Theodore Zhu, Chandler; Saied N. Tehrani, Tempe, both of Ariz.

[73] Assignee: Motorola, Inc., Schaumburg, Ill.

[21] Appl. No.: 874,436

[22] Filed: Jun. 16, 1997

[51] Int. Cl.$^6$ .................................................. G11C 11/15
[52] U.S. Cl. ............................................ 365/158; 365/173
[58] Field of Search .................................. 365/173, 158, 365/171, 157

[56] References Cited

U.S. PATENT DOCUMENTS 5,173,873  12/1992  Wu et al. .............................. 365/173
5,734,605  3/1998  Zhu et al. .............................. 365/158
5,768,181  6/1998  Zhu et al. .............................. 365/173
5,768,183  6/1998  Zhu et al. .............................. 365/173

*Primary Examiner*—Tan T. Nguyen
*Attorney, Agent, or Firm*—Eugene A. Parsons

[57] ABSTRACT

A new magnetic random access memory (MRAM) unit (30) is provided suitable for fabricating a MRAM device (20). The MRAM cell includes a magnetic storage element (32) and a current control element (33), for example, a diode, connected to the magnetic storage element in series to control a current in the magnetic storage element. The magnetic storage element has two magnetoresistive layers (36,38) separated by a non-magnetic layer (37), for example, aluminum oxide ($Al_2O_3$). The diode allows a current to flow in only an MRAM cell activated by a column line and a row line.

22 Claims, 3 Drawing Sheets

MULTI-LAYER MAGNETIC RANDOM ACCESS MEMORY AND METHOD FOR FABRICATING THEREOF

FIELD OF THE INVENTION

The present invention relates to a magnetic random access memory and its fabrication method, and more particularly, to a magnetic random access memory having a current control device and its fabrication method.

BACKGROUND OF THE INVENTION

A magnetic random access memory (MRAM) applying a giant magneto-resistive (GMR) effect has been developed as a non-volatile memory which includes GMR materials for a memory storage. The MRAM cell basically has three layers which comprises two layers of magnetic materials separated by a non-magnetic layer. In general, magnetic vectors of the two magnetic layers point in either a parallel or an anti-parallel direction when a magnetic field is removed and the magnetic layers have a width less than a width of magnetic domain walls. The MRAM employs these directions as logic states, for example, a parallel direction for a logic "0" and an anti-parallel direction for a logic "1". A magnetic field over a certain threshold level allows magnetic vectors to switch between parallel and anti-parallel directions.

In order to read logic states in the MRAM, a sense current is applied to the MRAM cell and a magnetic resistance across the MRAM cell is sensed from a voltage drop. Since the magnetic resistance corresponds to directions of magnetic: vectors, logic states are detected by the magnetic resistance.

The MRAM device highly integrates a plurality of MRAM cells on a substrate, each cell generally being positioned at intersections of word and bit lines and connected between them. When logic states are sensed and written in a target MRAM cell, both word and bit lines are activated to select the target MRAM cell. However, if the MRAM cells themselves are simply arrayed at intersections of word and bit lines, a problem arises in operations of reading and writing. Activation of the target MRAM cell produces not only a sense current but a sub-current flow detouring the target MRAM cell which causes improper operations in sensing.

Accordingly, there is a need for a multi-layer MRAM which correctly reads and writes states in a target MRAM cell and a method of fabricating the magnetic random access memory.

There is another need for a magnetic random access memory to prevent a sub-current from flowing in other MRAM cells.

SUMMARY OF THE INVENTION

This need and others are substantially met through provision of a MRAM having a current control element in each MRAM unit which controls a current flow in a magnetic storage element. The current control element as one embodiment includes a diode which is connected to the MRAM cell in series. The diode prevents the flow of a sub-current in MRAM cells. Another embodiment of the current control element is a transistor which is connected to the magnetic storage element in series. Turning on the transistor allows only the target MRAM cell to activate for sensing and writing operations.

DETAILED DESCRIPTION OF THE PREFERRED EMBODIMENTS

Figure 1:
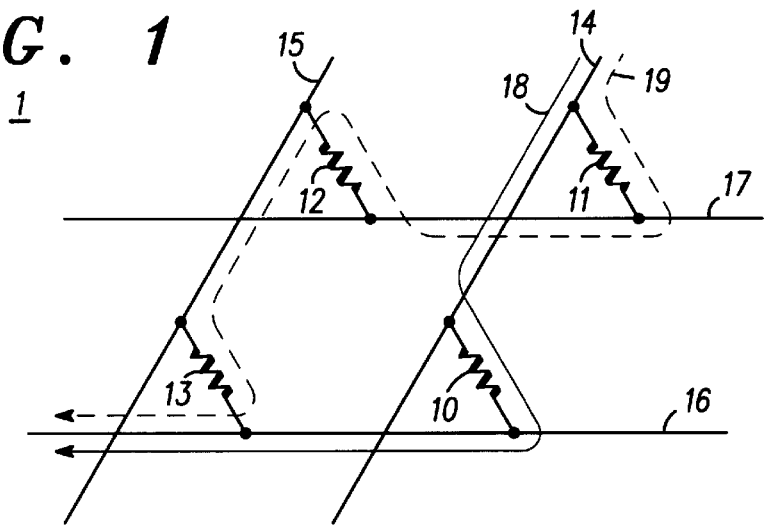
FIG. 1 shows a part of a memory array circuit explaining a background of the present invention.

Referring to FIG. 1, a part of memory array circuit 1 having four MRAM cells 10, 11, 12 and 13 is shown for explaining a sub-current flow. These MRAM cells 10, 11, 12 and 13 are positioned between word lines 14 and 15 and bit lines 16 and 17. For instance, MRAM cell 10 is connected between word line 14 and bit line 16. In order to read states in MRAM cell 10, for example, word line 14 and sense line 16 are activated to provide a sense current. As indicated by a solid arrow 18, the sense current flows from word line 14 through MRAM cell 10 to bit line 16. Since a magnetic resistance of MRAM cell 10 depends on states, a voltage drop across MRAM cell 10 is sensed, then a logic state in MRAM cell 10 is read. However, activation of word line 14 and sense line 16 also produces a sub-current flow, as shown by a dotted arrow 19, from word line 14 through MRAM cell 11, bit line 17, MRAM cell 12, word line 15 and MRAM cell 13, to bit line 16. This sub-current flow causes an erroneous voltage drop that appears to be across MRAM cell 10, so that a wrong state is sensed.

Figure 2:
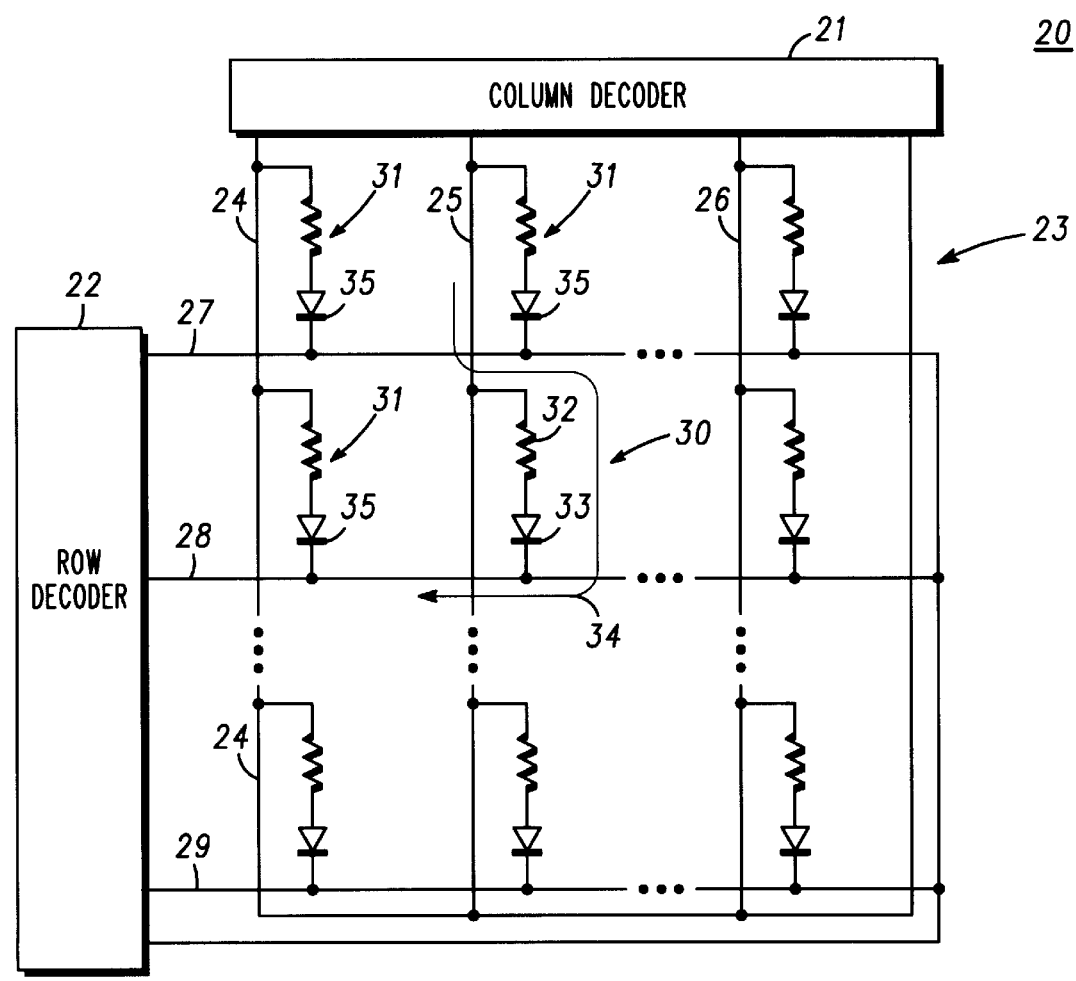
FIG. 2 shows a circuit diagram of a MRAM device in accordance with a present invention.

To prevent the sub-current from flowing in MRAM cells other than the target MRAM cell, the present invention provides a new MRAM unit which includes a MRAM cell and a current control element connected to the MRAM cell in series. The current control element prohibits the sub-current flow from occurring and detouring through other MRAM cells. FIG. 2 shows a circuit diagram of a MRAM device 20 having a plurality of MRAM units, one of which is described in FIG. 3, which employs a diode as the current control element in accordance with the present invention. The structure and characteristics of the MRAM cell are explained in conjunction with FIGS. 3 and 4 hereinafter.

Referring to FIG. 2, MRAM device 20 includes a column decoder 21, a row decoder 22, and a memory array 23. Memory array 23 has a plurality of column lines 24, 25, and 26, a plurality of row lines 27, 28, and 29, and a plurality of MRAM units 30 and 31, each cell being positioned on intersections of column lines 24, 25, and 26 and row lines 27, 28, and 29. MRAM unit 30, for example, is connected between column line 25 and row line 28. MRAM unit 30 comprises a MRAM cell 32 connected to column line 25 and a diode 33 connected to row line 28.

In the operation of reading states in MRAM cell 32, column and row decoders 21 and 22 select and activate column line 25 and row line 28, respectively. The activation produces a sense current flowing from column line 25 through MRAM cell 32 and diode 33 to row line 28, as indicated by solid arrow 34. The sense current causes a voltage drop across MRAM cell 32 dependent on the direction of magnetic vectors within MRAM cell 32. The voltage drop is detected in row decoder 22 to determine states stored in MRAM cell 32. No sub-current flow (e.g. sub-current 19 as indicated in FIG. 1) generates in any MRAM cells because diodes 35 prohibit the sub-current from flowing in MRAM units 31.

Further, when states are written in MRAM cell 32, column and row lines 25 and 28 are activated to produce a column current on column line 25 and a row current on row line 28. Column and row currents generate magnetic fields in MRAM cell 32, and a combination of these magnetic fields changes and switches magnetic vectors in MRAM cell 32 to a desired direction. Column and row currents generated by column and row decoders 21 and 22 are provided only on column line 25 and row line 28, respectively. The activation of column line 25 and row line 28 never affect or change states in MRAM cells 31.

Figure 3:
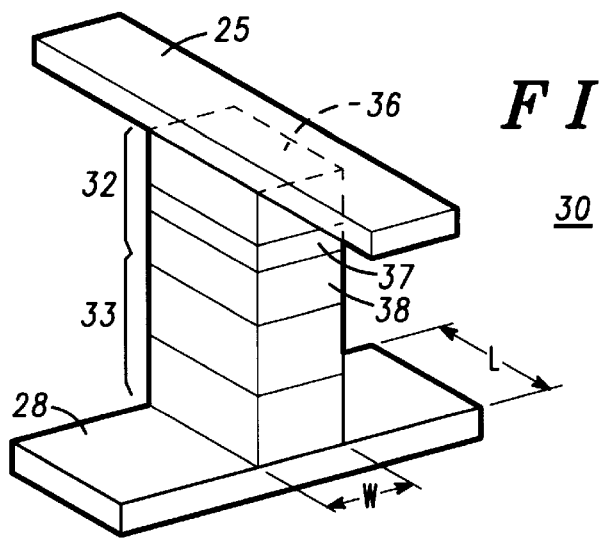
FIG. 3 shows a simplified and enlarged perspective view illustrating a MRAM unit in accordance with the present invention.
Figure 4:
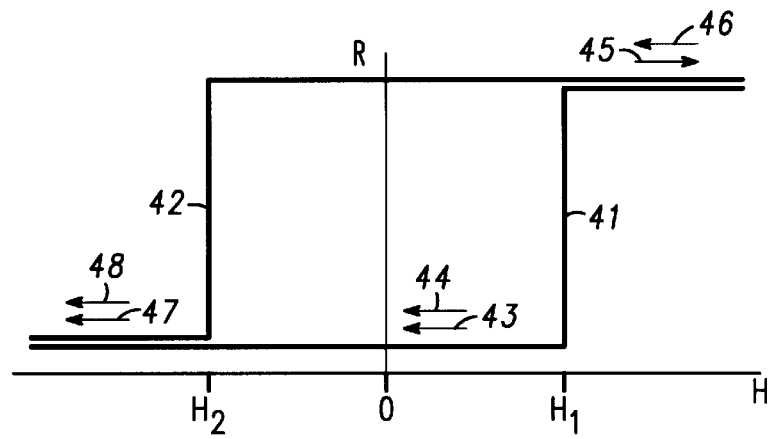
FIG. 4 shows cell characteristics of a MRAM cell illustrated in FIG. 3.

Referring to FIGS. 3 and 4, a simplified and enlarged perspective view of MRAM unit 30 in FIG. 2 and cell characteristics of MRAM cell 32 in MRAM unit 30 are illustrated, respectively. In FIG. 3, MRAM cell 32 and diode 33 are connected in series between top or column line 25 and bottom or row line 28. MRAM cell 32 has three layers that include a first magnetic layer 36 and a second magnetic layer 38, which are separated by an insulating spacer layer 37. Magnetic layers 36 and 38 each can be single layers of ferromagnetic materials such as a layer of nickel, iron, cobalt, or alloys thereof including alloys having palladium or platinum therein. Alternatively, either of layers 36 and 38 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 37 include most non-conductive materials such as oxides, nitrides, dielectrics, etc. Additionally, layers 36, 37 and 38 have a width W and a length L as shown in FIG. 3. Magnetic characteristics of MRAM cell 32 vary in accordance with a length/width ratio (L/W ratio). A relationship of a length/width ratio (L/W ratio) and a strength of magnetic field is described in a U.S. patent applications No. 08/701,355, titled MRAM WITH PINNED ENDS, filed Sep. 23, 1996, and Motorola Docket No. CR97-004, titled MAGNETIC DEVICE HAVING MULTI-LAYER WITH INSULATING AND CONDUCTIVE LAYERS, filed Apr. 1, 1997, both are incorporated by reference herein.

MRAM cell 32 can have any L/W ratio for carrying out the present invention and, in this application a L/W ratio which is less 5, for example, is used. As a typical embodiment, 0.1 $\mu$m and 0.1–0.3 $\mu$m are selected for L and W, respectively. Under this configuration MRAM cell 32 has the cell characteristics illustrated in FIG. 4. Pairs of arrows indicated in FIG. 4 represent directions of magnetic vectors in first and second layers 36 and 38, respectively. The abscissa of the graph indicates magnetic field direction and strength and the ordinate represents the resistance of cell 32. Further, a first curve 41 indicates the cell resistance which can be achieved for the application of various strengths of a magnetic field in a first direction and curve 42 indicates the cell resistance which can be achieved for the application of various strengths of a magnetic field in a second direction.

Assuming memory cell 32 is in the state in which magnetic vectors 43 and 44 point to the parallel under no magnetic field, moving to the right along the abscissa, the magnetic field increases up to a value $H_1$. Before the value $H_1$ is reached, magnetic vectors 43 and 44 are oriented in the parallel, and the magnetic resistance of cell 32 is low. Upon applying sufficient magnetic field $H_1$ to cell 32, vector 43 in layer 38 switches to the right direction (as shown) and the magnetic resistance of cell 32 increases perceptibly. Then, the vectors, designated 45 and 46 to indicate the change, point in the anti-parallel under a magnetic field beyond the value $H_1$. Note that layer 36 is constructed so that the magnetic vector (44, 46) does not switch under the same magnetic field that switches the magnetic vector (43, 45) of layer 38. When the magnetic field decreases down to a value $H_2$, moving to the left along curve 42, vectors 45 and 46 hold the anti-parallel direction between values $H_1$ and $H_2$. Upon applying the magnetic field of the value $H_2$, vector 45 of layer 38 switches to a left direction, represented as vector 47, so that vectors 47 and 48 point to the same direction and the magnetic resistance of cell 32 decreases sharply.

Figure 5:
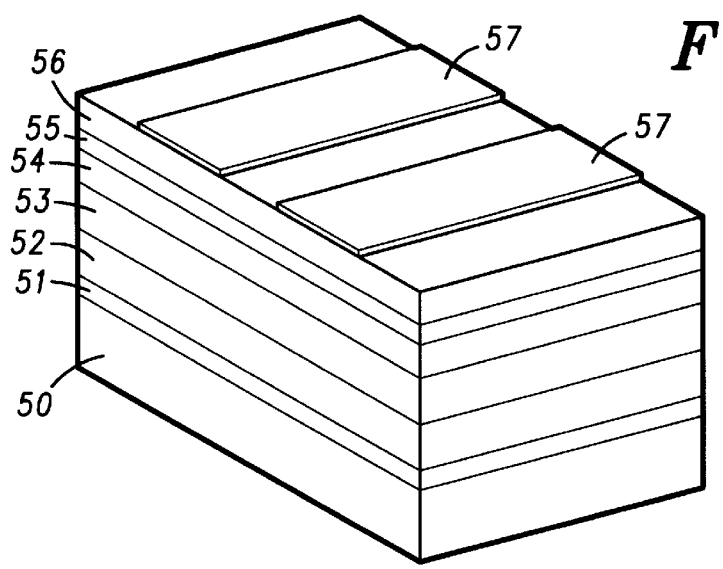
FIGS. 5–7 show simplified and enlarged perspective views illustrating a process of fabricating a MRAM device in accordance with the present invention.
Figure 6:
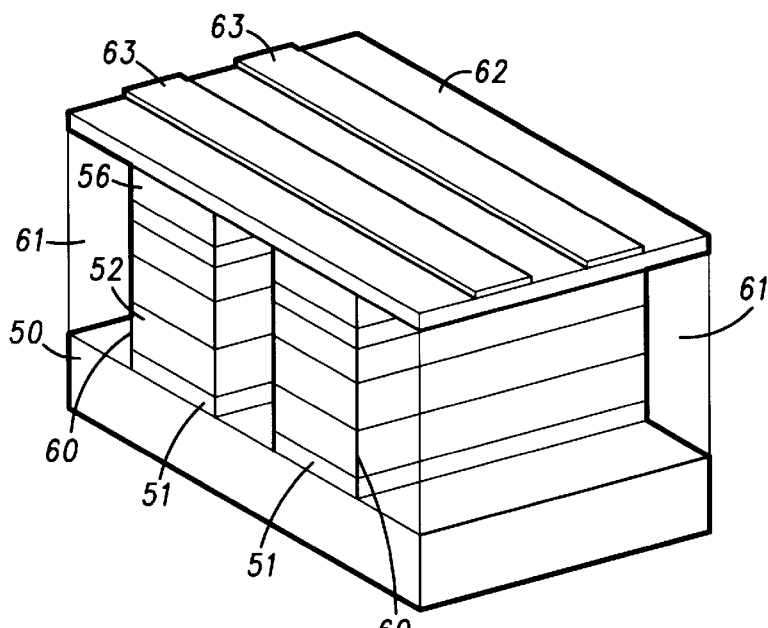
Figure 7:
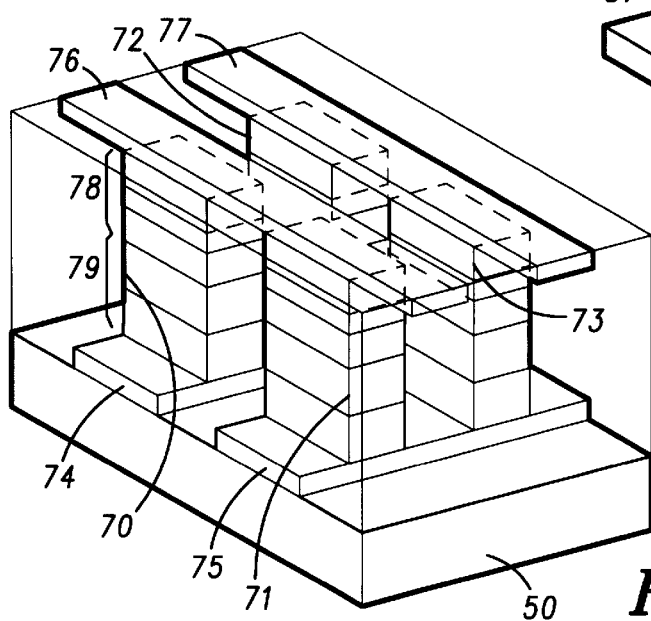

Referring to FIGS. 5–7, several sequential process steps are illustrated to better understand the present method of fabricating the MRAM device. FIGS. 5–7 show a manufacturing process to finally form four MRAM units for simplicity, however more MRAM units may be fabricated with the same manufacturing process. Referring to FIG. 5, a substrate 50, such as semiconductor, glass, or other convenient materials is provided on which the MRAM device is formed. On a surface of substrate 50, electrically conductive layer 51 is deposited by a sputtering method for row line 28, which is Aluminum (Al), copper (Cu), or alloy thereof ($Al_{1-x}Cu_x$). Then p-type poly-silicon and n-type poly-silicon layers 52 and 53 are sequentially deposited on layer 51 to form the diode. After depositing, layers 52 and 53 are annealed at 700°–800° C. to recrystallize and activate poly-silicon layers 52 and 53. After depositing a magnetic layer 54, a non-magnetic layer 55 and a magnetic layer 56 are deposited sequentially by a sputtering method to form the MRAM cell. A first etching mask 57, which is patterned with stripes by a well known photolithography technique, is prepared on magnetic layer 56. It is also possible to form a Schottky diode with a Schottky metal layer and a semiconductor layer. There layers are contacted to form a Schottky barrier therebetween.

Referring to FIG. 6, in accordance with the first etching mask 57, multiple layers 51–56 shown in FIG. 5 are selectively and vertically etched to the surface of substrate 50 so that a plurality of structures 60 remain as shown in FIG. 6. Etched portions 61 are filled with dielectric material up to a surface of magnetic layer 56 by Chemical Vapor Deposition (CVD). A surface of dielectric material 61 is polished by Chemical Mechanical Polishing (CMP) so as to flatten it at the same height with the surface of magnetic layer 56. Then, electrically conductive layer 62 is deposited on the flat surface of structures 60 and dielectric material portions 61. A second etching mask 63 is prepared on the conductive layer 62. The second etching mask has a stripe pattern, which is formed perpendicular to the stripes 57 of the first etching mask.

Referring to FIG. 7, in accordance with the second etching mask 63, layers 52–56, and 62 are vertically etched until a surface of first electrically conductive layer 51 appears. Then dielectric material 61 is deposited by CVD to cover all of the elements. With the above process, MRAM devices as illustrated in FIG. 7 are fabricated on substrate 50. MRAM units 70–73 are placed between row lines 74 and 75 and column lines 76 and 77. Each MRAM unit has a MRAM cell and a diode. For example, MRAM unit 70 has a MRAM cell 78 and a diode 79 connected in series between row line 74 and column line 76. For simplicity, four MRAM units are fabricated as illustrated in FIG. 7, however it is possible for a person skilled in the art to make a highly integrated MRAM device including hundreds or thousands of MRAM units.

Figure 8:
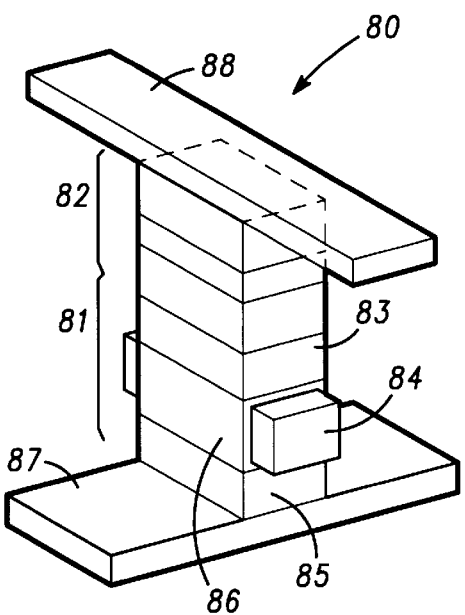
FIG. 8 shows simplified and enlarged perspective views illustrating another MRAM unit in accordance with the present invention.

FIG. 8 shows another MRAM unit 80 in which a transistor 81 is connected to MRAM cell 82 in series as the current control element. Transistor 81, for example, is a MOS transistor which comprises a drain 83, a gate 84, a source 85, and a channel region 86. MRAM unit 80 is placed between row line 87 and column line 88 in the same way as explained above. Only when MRAM cell 82 is accessed to read states, transistor 81 is turned on, thereby a sense current flow between row line 87 and column line 88. Accordingly, the transistor prevents a sub-current from flowing in other MRAM cells and allows a sense current to flow in only a target MRAM cell.

Thus, a MRAM unit which includes a current control element is disclosed. A diode or a transistor connected to a MRAM cell in series prevent a sub-current from flowing in other MRAM cells so that states are correctly read and written in the target MRAM cell. Further, a fabrication process for the MRAM device is disclosed. The process utilizes two etching masks to fabricate the MRAM device. Accordingly, the process is possible to easily fabricate the MRAM device and reduce a production cost of the MRAM device.

We claim:

1. A multi-layer magnetic random access memory unit comprising:
   a magnetic storage element having a first magnetoresistive layer and a second magnetoresistive layer separated by a non-magnetic material layer; and
   a current control element, connected to the magnetic storage element in series and made from poly-silicon, for controlling a current in the magnetic storage element;
   wherein the magnetic storage element has a length and a width, the width being less than a width of magnetic domain walls within the first and second magnetoresistive layers.

2. The multi-layer magnetic random access memory unit as claimed in claim 1 wherein the current control element is a diode.

3. The multi-layer magnetic random access memory unit as claimed in claim 2 wherein the diode includes a first layer having a first conductive type and a second layer having a second conductive type opposite to the first conductive type, both layers being made from poly-silicon.

4. The multi-layer magnetic random access memory unit as claimed in claim 3 wherein the first layer is electrically connected to the second magnetoresistive layer.

5. The multi-layer magnetic random access memory unit as claimed in claim 3 wherein the first and second conductive types are a p-type and a n-type, respectively.

6. The multi-layer magnetic random access memory unit as claimed in claim 2 wherein the diode includes a Schottky diode having a metal layer and a semiconductor layer connected to the metal layer.

7. The multi-layer magnetic random access memory unit as claimed in claim 1 wherein the first and second magnetoresistive layers are ferromagnetic material.

8. The multi-layer magnetic random access memory unit as claimed in claim 1 wherein the magnetic storage element forms a tunneling junction between the first and second magnetoresistive layers.

9. The multi-layer magnetic random access memory unit as claimed in claim 8 wherein a thickness of the non-magnetic material layer is less than 30 Angstrom.

10. The multi-layer magnetic random access memory unit as claimed in claim 1 wherein the current control element is a transistor.

11. The multi-layer magnetic random access memory unit as claimed in claim 1 further including a first electrically conductive line and a second electrically conductive line perpendicular to the first electrically conductive line, the first electrically conductive line being connected to and positioned on the first magnetoresistive layer, and a second electrically conductive line being connected to and positioned on the current control element.

12. The multi-layer magnetic random access memory unit as claimed in claim 11 wherein the current control element is a diode including a first layer having a first conductive type and a second layer having a second conductive type opposite to the first conductive type, both layers being made from poly-silicon.

13. The multi-layer magnetic random access memory unit as claimed in claim 11 wherein the diode includes a Schottky diode having a metal layer and a semiconductor layer connected to the metal layer.

14. The multi-layer magnetic random access memory unit as claimed in claim 11 wherein the current control element is a transistor having a first electrode connected to the second magnetoresistive layer, a second electrode connected to the second electrically conductive line, a channel region between the first and second electrodes, and a gate electrode positioned on the channel region.

15. A magnetic random access memory device comprising:
   a substrate having a surface;
   a memory cell array on the surface of the substrate including a plurality of magnetic random access memory cells arranged in rows and columns on the substrate, each cell comprising:
      a magnetic storage element having a first magnetoresistive layer and a second magnetoresistive layer with a length and a width separated by a non-magnetic material layer, the width being less than a width of magnetic domain walls within the first and second magnetoresistive layers; and
      a current control element, connected to the magnetic storage element in series and made from poly-silicon, for controlling a current in the magnetic storage element;
   a plurality of first electrically conductive lines, each line connected to the magnetic random access memory cells in a column; and
   a plurality of second electrically conductive lines, each line connected to the magnetic random access memory cells in a row;
   wherein the magnetic storage element has a length and a width, the width being less than a width of magnetic domain walls within the first and second magnetoresistive layers.

16. The magnetic random access memory device of claim 15 wherein the first electrically conductive lines are connected to the magnetic storage elements and the second electrically conductive lines are connected to the current control elements.

17. The magnetic random access memory device of claim 15 further including a column decoder connected to the first electrically conductive lines and a row decoder connected to the second electrically conductive lines, the column decoder activating one of the first electrically conductive lines and the row decoder activating one of the second electrically conductive lines, thereby the magnetic random access memory cell connected to the activated first and second electrically conductive lines is selected.

18. The magnetic random access memory device as claimed in claim 15 wherein the current control element is a diode.

19. The magnetic random access memory device as claimed in claim 15 wherein the current control element is a transistor.

20. The magnetic random access memory device as claimed in claim 19 wherein the transistor has a first electrode connected to the second magnetoresistive layer, a second electrode connected to the second electrically conductive line, a channel region between the first and second electrodes, and a gate electrode positioned on the channel region.

21. The magnetic random access memory device as claimed in claim 19 wherein when the first and second electrically conductive lines are activated, the transistor coupled between the activated first and second electrically conductive lines turns on in order to flow a current through the magnetic random access memory cell.

22. The multi-layer magnetic random access memory unit as claimed in claim 15 wherein the first and second electrically conductive lines are activated to generate first and second magnetic fields, respectively, a combination of the first and second magnetic fields allowing states in the magnetic storage element to change.

* * * * *

UNITED STATES PATENT AND TRADEMARK OFFICE
CERTIFICATE OF CORRECTION

PATENT NO.    : 5,838,608
DATED         : November 17 1998
INVENTOR(S)   : Zhu et al.

It is certified that error appears in the above-identified patent and that said Letters Patent is hereby corrected as shown below:

<u>Column 1,</u>
Line 4, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*